(12) United States Patent
Lupo et al.

(10) Patent No.: US 12,052,029 B2
(45) Date of Patent: Jul. 30, 2024

(54) METHODS AND DEVICES FOR ADAPTIVE VOLTAGE STEADYING

(71) Applicant: STMicroelectronics S.r.l., Agrate Brianza (IT)

(72) Inventors: Nicola Lupo, Barletta (IT); Enrico Mammei, Vittuone (IT); Michele Bartolini, Carpiano (IT); Stefano Colli, Pavia (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 234 days.

(21) Appl. No.: 17/690,847

(22) Filed: Mar. 9, 2022

(65) Prior Publication Data

US 2023/0291416 A1 Sep. 14, 2023

(51) Int. Cl.
- *H03M 1/66* (2006.01)
- *H03F 3/21* (2006.01)
- *H03M 1/06* (2006.01)
- *H03M 1/78* (2006.01)

(52) U.S. Cl.
CPC ............... *H03M 1/66* (2013.01); *H03F 3/21* (2013.01); *H03M 1/06* (2013.01); *H03M 1/78* (2013.01)

(58) Field of Classification Search
CPC ............ H03M 1/66; H03M 1/06; H03M 1/78; H03M 10/42; H03F 3/21
See application file for complete search history.

(56) References Cited

U.S. PATENT DOCUMENTS

| 4,309,693 A * | 1/1982 | Craven | H03M 1/74 326/62 |
|---|---|---|---|
| 2012/0050085 A1 | 3/2012 | Kon | |

OTHER PUBLICATIONS

Chen, W. et al., "A Digitally Controlled On-Chip Monotonic Reference Current Generator with Low LSB Current for Fast and Accurate Optical Level Monitoring," Department of Microelectronics & Computer Science, Technical University of Lodz, Jun. 22-24, 2006, 6 pages.

Lupo, N. et al., "On the Linearity of BJT-Based Current-Mode DAC Drivers," IEEE Transactions on Circuits and Systems—II: Express Briefs, vol. 68, No. 9, Sep. 2021, 5 pages.

* cited by examiner

*Primary Examiner* — Joseph J Lauture
(74) *Attorney, Agent, or Firm* — Slater Matsil, LLP

(57) ABSTRACT

A method to drive a digital to analog converter (DAC), the method including setting a reference current for the DAC with a reference current source, a base voltage being responsive to changes in a reference voltage at a reference node coupled with the reference current source; sensing a change in the reference voltage; and adaptively steadying the base voltage based on the change in the reference voltage to maintain proportionality between an output current of the DAC and the reference current.

20 Claims, 9 Drawing Sheets

METHODS AND DEVICES FOR ADAPTIVE VOLTAGE STEADYING

TECHNICAL FIELD

The present invention relates generally to a systems and methods for adaptive converter drivers.

BACKGROUND

Generally, current-driving operations for a variety of technologies, including digital to analog converters, benefit from fast switching speeds, process independent performance, accuracy, and linearity. This may be especially true in various high performance applications. Improved devices and techniques for current driving are needed.

SUMMARY

In accordance with an embodiment, an adaptive current driving system includes: a digital to analog converter (DAC) including: an input to receive a digital code including a number N bits; and N DAC cells, each of the N DAC cells including a bipolar transistor, and each of the N DAC cells being configured to be activated depending on a state of a corresponding bit of the digital code; a reference stage including a reference bipolar transistor coupled at a collector with a reference current source and being coupled at a base with the bases of the bipolar transistors of the N DAC cells; and a voltage stabilization stage including a voltage sensing stage coupled with a reference node to sense a change in a voltage at the reference node, the reference node being coupled with the collector of the reference bipolar transistor, a voltage follower coupled with the voltage sensing stage and configured to buffer a voltage signal, the voltage signal depending on the change in the voltage at the reference node, and an output stage configured to adaptively steady a base voltage at the base of the reference bipolar transistor depending on the voltage signal.

In accordance with an embodiment, a voltage stabilization stage for a digital to analog converter (DAC) includes a voltage sensing stage coupled with a reference node to sense a change in a voltage at the reference node, the reference node be coupled with a reference current source; a voltage follower coupled with the voltage sensing stage and configured to buffer a voltage signal, the voltage signal depending on the change in the voltage at the reference node; and an output stage configured to output a base voltage depending on the voltage signal.

In accordance with an embodiment, a method to drive a digital to analog converter (DAC), includes setting a reference current for the DAC with a reference current source, a base voltage being responsive to changes in a reference voltage at a reference node coupled with the reference current source; sensing a change in the reference voltage; and adaptively steadying the base voltage based on the change in the reference voltage to maintain proportionality between an output current of the DAC and the reference current.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Current drivers are used in many applications to provide currents needed for other operations. Current drivers can be embedded in Digital to Analog Converters (DAC). The output current of a DAC may be a function of a reference current (advantageously constant) and a digital input for the DAC, which may be changed by the user.

Figure 1:
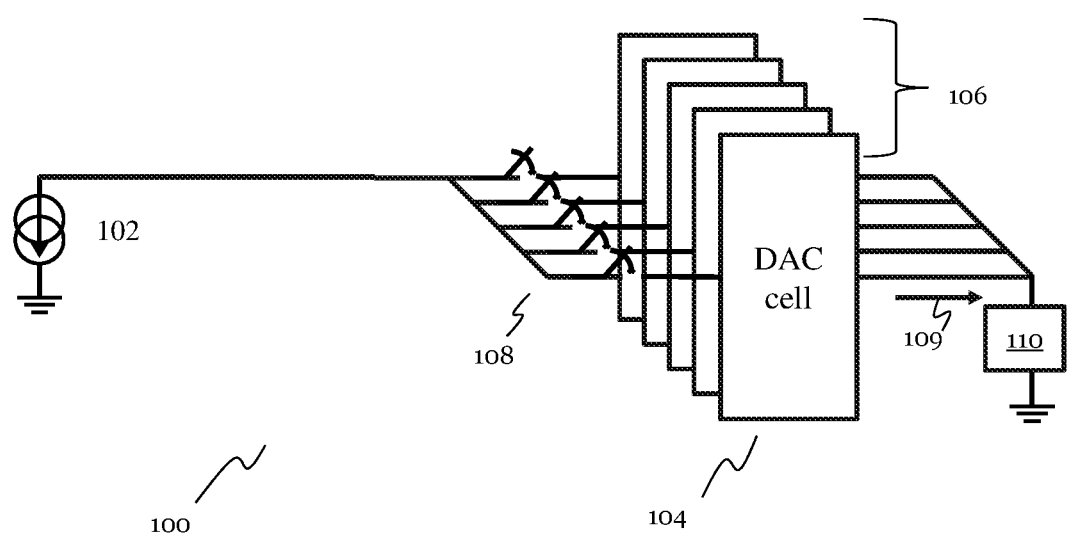
FIG. 1 depicts a schematic for a known DAC current driving system.

FIG. 1 depicts a schematic for a known DAC current driving system.

The DAC current driving system 100 includes a reference current generator 102. The current may be provided to a DAC 104. The DAC 104 includes a number of DAC cells 106 and a corresponding number of switches 108. The DAC 104 may receive a digital code at a digital input (not shown in FIG. 1). The switches are opened or closed depending on the digital code received by the DAC 104. This activates the corresponding DAC cell, which is combined with the reference current to provide an output current 109. The output current 109 can then be provided to a load 110. For example, DAC 104, which may comprise a five-bit DAC, may receive a digital input signal "10001." In response, switches corresponding to the most significant bit and the least significant bit may be closed to activate corresponding DAC cells. Current is added accordingly to the output which is then transferred to the load.

Speed, accuracy, and reliability are important performances for a DAC-based current driver. The output current should be consistent across different environmental and operating conditions that can affect relationships among different components of a DAC. An inappropriate management of the system can limit the accuracy of the DAC and, consequently, its resolution (the number of bits accommodated by the DAC). The system also needs to quickly respond to variations created due to switching, which may be especially challenging when all switches are simultaneously closed thereby requiring a significant change in the current demands of a DAC.

Various technological spaces require highly accurate and fast digital to analog conversion. Unreliable current can hamper performance in these areas. Some examples include DACs for optical systems such laser diodes in optical systems. Bipolar technologies may be preferred to achieve high switching speed simultaneously with high current capabilities. However, issue persist with known approaches.

Figure 2:
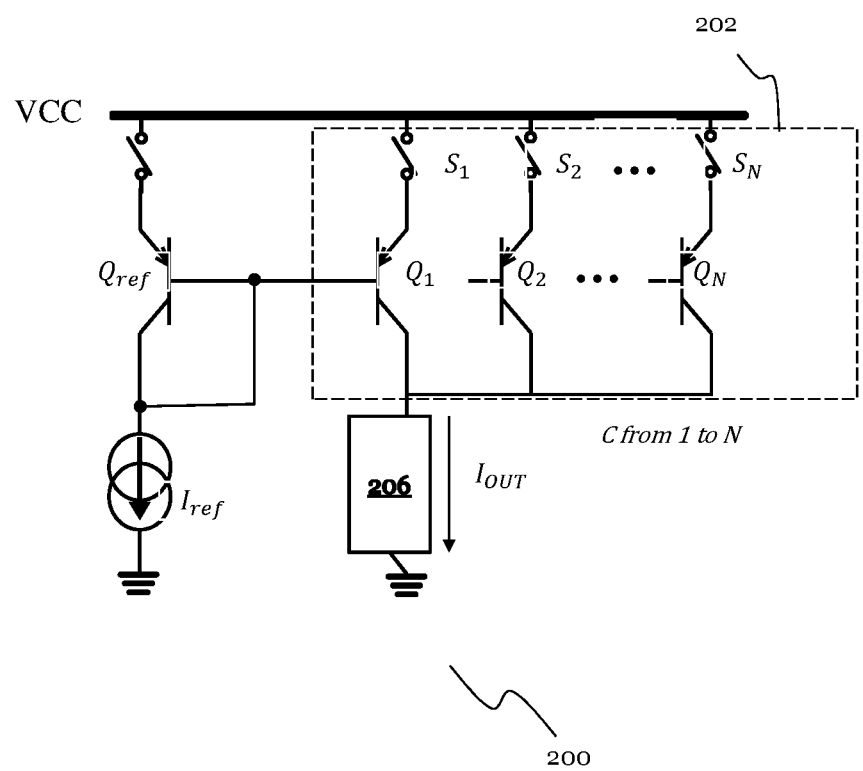
FIG. 2 depicts a known current driving system for a DAC.

FIG. 2 depicts a known current driving system for a DAC.

The system 200 from FIG. 2 may comprise a DAC 202. The DAC includes a number of bipolar transistors $Q_1$, $Q_2 \ldots Q_N$. The DAC 202 also includes a number of switches $S_1, S_2 \ldots S_N$. The switches and bipolar transistors correspond to the resolution of the DAC 202. The switches may be toggled between open and closed states depending on a digital input to the DAC 202. When closed, emitters of the bipolar transistors are coupled with a voltage VCC. The base current for the bipolar transistors is determined by a reference current $I_{ref}$. The base current (when the corresponding switch is closed) is amplified by a factor β to the collector of the bipolar transistor. Current from the collectors are combined to provide the output current $I_{out}$ to the load 206 The output current $I_{OUT}$, thus, depends on the digital code received by the DAC 202.

The system further comprises a reference bipolar transistor $Q_{ref}$ arranged in a "current mirror" configuration by shorting the collector of the bipolar transistor $Q_{ref}$ with the base. This yields an output current that is a function of the digital input code to the DAC 202, the reference current $I_{ref}$, and the beta factor. This is described by Equation 1 below.

$$I_{OUT}[c] = \frac{c * I_{ref}}{1 + \frac{c+1}{\beta}} \qquad \text{Equation 1}$$

In Equation 1, the term "c" refers to the number of switches closed in response to a digital code received by a DAC. In various circumstances it may be desired to develop more accurate mirroring factor to provide a base current that better matches reference current. Further, less dependence on the beta factor of a bipolar transistor may be desired. The beta factor may be subject to variation depending on environmental and operating conditions. Accuracy may also be impacted as the number of DAC cells of a DAC are increased or as more cells are activated in response to a given logic code. The output current of the DAC may also exhibit non-linearity due to the code dependency. Moreover, the turn on and turn off may be slower than desirable.

A known approach for accounting for the beta dependency of a current mirror configuration as depicted in FIG. 2 is a beta helper configuration.

Figure 3:
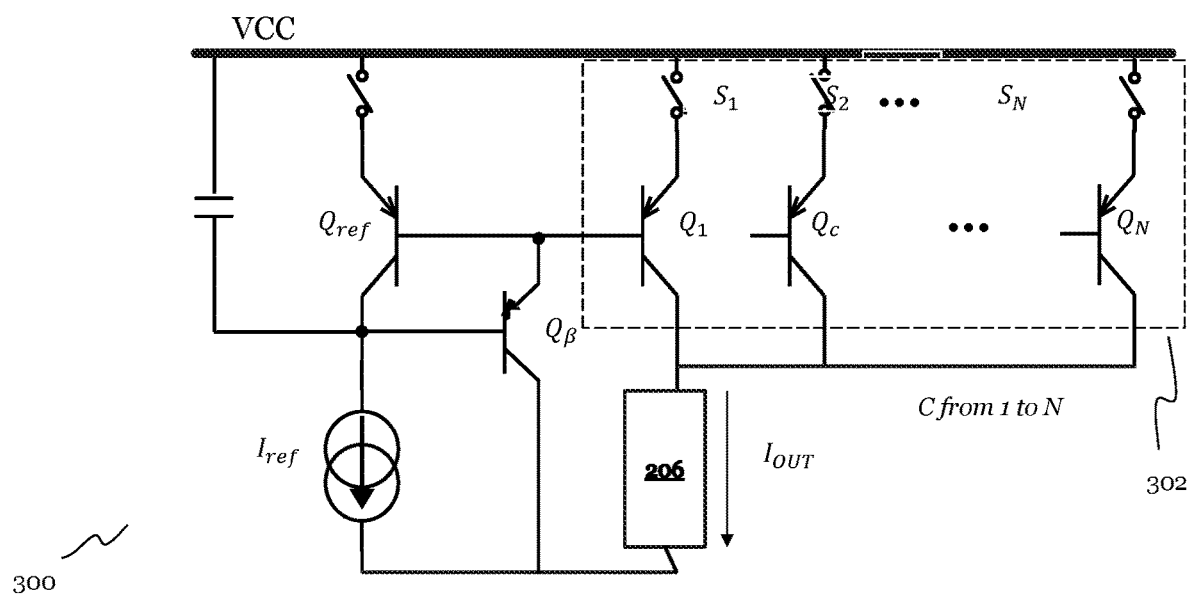
FIG. 3 depicts a known current driver system for a DAC comprising a beta helper.

FIG. 3 depicts a known current driver system for a DAC comprising a beta helper.

The system 300 includes a DAC 302. The DAC operates like the DAC 202 described with reference to FIG. 2. The DAC 302 receives an input digital code "c." Switches $S_1$, $S_2 \ldots S_N$ are toggled to a closed or open state depending on the digital input code to modify the proportionality factor between output current and reference current supplied to the DAC 302. The DAC cells comprise one of the bipolar transistors $Q_1, Q_2 \ldots Q_N$. Opening or closing the corresponding switch couples a corresponding bipolar transistor with a voltage VCC at an emitter of the corresponding bipolar transistor. Currents provided at the base (or bases) of bipolar transistors of active DAC cells (cells with closed switches) are amplified at the collectors of the corresponding transistor. Currents generated by active DAC cells are combined to form an output current $I_{OUT}$ that is provided to a load.

A bipolar transistor $Q_{ref}$ is coupled with reference current $I_{ref}$ at a collector and with VCC at an emitter. The base of the reference bipolar transistor $Q_{ref}$ is coupled with the bases of the bipolar transistors $Q_1, Q_2 \ldots Q_N$. The base of the bipolar transistors are also coupled with a beta helper transistor $Q_\beta$. In particular, the emitter of the beta helper transistor $Q_\beta$ is coupled with the base of bipolar transistor $Q_{ref}$ and with the bases of the bipolar transistors $Q_1, Q_2 \ldots Q_N$. The base of the $Q_\beta$ is coupled with the collector of the bipolar transistor $Q_{ref}$. This arrangement reduces the beta dependency of the output current $I_{OUT}$ when compared to Equation 1. Equation 2 describes the relationship.

$$I_{OUT}[c] = \frac{c * I_{ref}}{1 + \frac{c+1}{\beta^2}} \qquad \text{Equation 2}$$

The arrangement depicted in FIG. 3, reduces the beta dependency of the output current $I_{OUT}$ by a factor of beta. However, as apparent from the Equation 2, the output is still dependent on the input code C. And, this limits the linearity of the output current provided by DAC 302. Further, the beta helper does not aid speed of turn off transitions. In various situations, it may be advantageous to provide a base current that allows a linear output from a DAC, fast turn on and turn off times, and high reliability. Adaptive current driving systems in accordance with embodiments of the present disclosure allow balancing of dynamic and static current driving demands provide high reliability, fast turn off and turn on times, high accuracy, and high efficiency.

Beta dependency may be eliminated by substituting a PMOS for beta helper transistor $Q_\beta$ However, more improvements may be desired in turn on and turn off switching times, and the switching response of the circuit. In various embodiments of the present invention a BiCMOS follower coupled with a class AB amplifier may efficiently drive total base capacitance during turn on and turn off transients. Further, advantageously, tradeoffs between dynamic performances and power consumption may be regulated by tuning a biasing current for the class AB amplifier.

Figure 4:
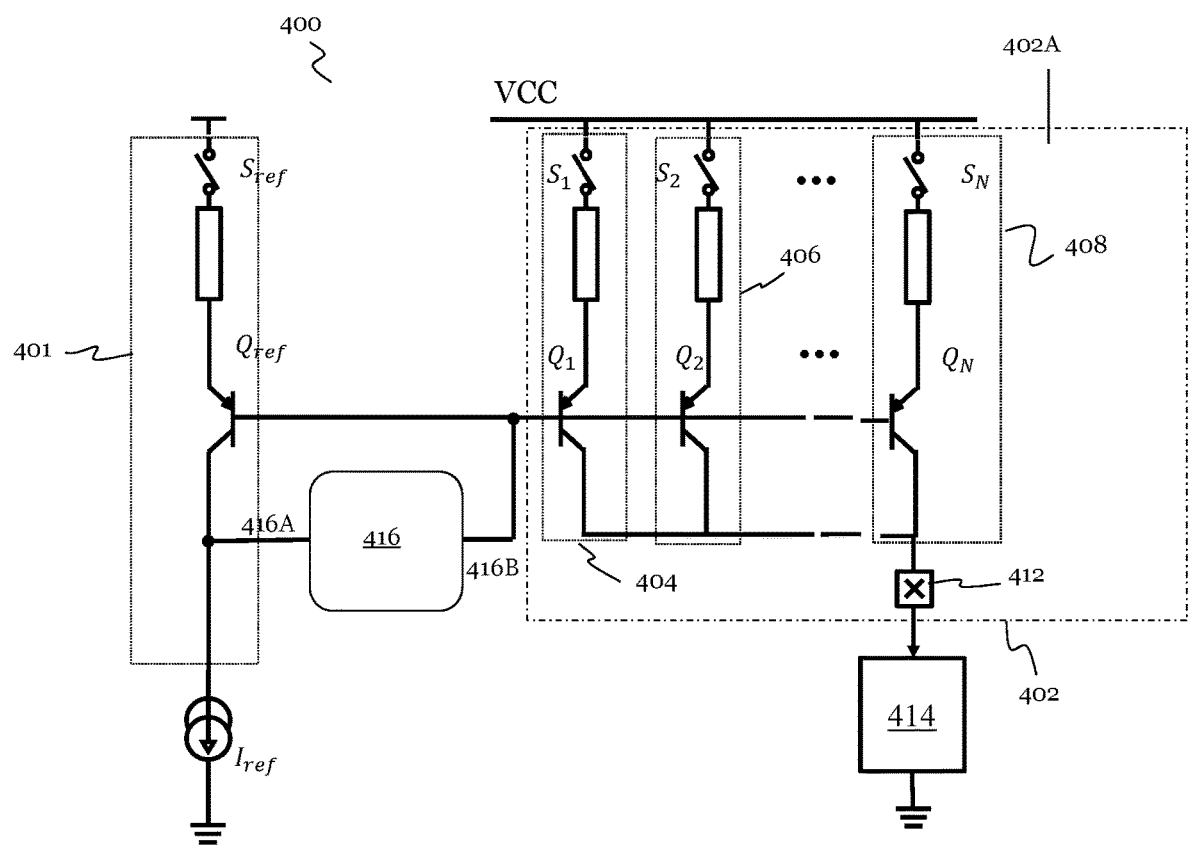
FIG. 4 depicts an adaptive current driving system consistent with an embodiment.

FIG. 4 depicts an adaptive current driving system in accordance with an embodiment.

An adaptive current driving system 400 may comprise a DAC 402. The DAC 402 may comprise bipolar transistors Q1, Q2, . . . $Q_N$. As it will be appreciated, different polarity switching elements may be utilized in different embodiments. For example, CMOS transistors (including n-type or p-type), BJTs (including PNP or NPN), or other types of transistors. The DAC 402 may also comprise a number of switches S1, S2, . . . $S_N$. The number of switches may correspond to the number of bipolar transistors and the resolution of the DAC 402. The DAC 402 may comprise in input 402A to receive a digital input. The bits of the digital input code may correspond to switches of the DAC.

The input code may determine which switches are open and which ones are closed. As will be appreciated, this may also determine which transistors are coupled with voltage VCC. For example, a first bit of an input code may determine whether a first switch S1 is open or closed, a second bit of an input code may determine whether a second switch S2 is open or closed, and an Nth bit of an input code may determine whether an Nth switch $S_N$ is open or closed. Internal bussing, not shown in FIG. 4, may carry the bits of the digital input signal to the corresponding switches. As will be appreciated, switches S1, S2, . . . $S_N$ may comprise different types of switches in various embodiments. A first DAC cell 404 may comprise the first switch S1 and the first bipolar transistor Q1. A second DAC cell 406 may comprise the second switch S2 and the second bipolar transistor Q2. An Nth DAC cell 408 may comprise the Nth switch SN and the Nth bipolar transistor $Q_N$.

When the corresponding switch is closed, the emitter of a transistor may be coupled with VCC and the collector with an output terminal 412. An active bipolar transistor may amplify the current at its base. The collector currents may be added together and provided at the output terminal 412. An output current $I_{OUT}$ can then be provided to a load 414 and the output current, thus, is proportional to the digital input.

The adaptive current driving system 400 may further comprise a reference bipolar transistor $Q_{REF}$. The reference bipolar transistor may be disposed in a reference stage 401 of the system 400. The base of the bipolar transistor $Q_{REF}$ may be coupled with the bases of the bipolar transistors $Q_1$, $Q_2$, ... $Q_N$. A reference current source $I_{ref}$ may be coupled with the collector of the reference bipolar transistor $Q_{ref}$.

The adaptive current driving system 400 may comprise a switch $S_{ref}$. The switch $S_{ref}$ may be used to enable and disable the DAC 402. It may be advantageous to have a switch $S_{ref}$ for energy efficiency purposes.

The adaptive current driving system 400 may further comprise an voltage stabilization stage 416. The voltage stabilization stage 416 may be coupled with the collector of the bipolar transistor $Q_{ref}$ at a reference node 416A. The voltage stabilization stage 416 may be coupled at a output node 416B with the base of bipolar transistor $Q_{ref}$, and with the bases of the bipolar transistors Q1, Q2, ... $Q_N$. The voltage stabilization stage may adaptively steady the voltage at output node 416B to adjust the current drawn (or provided) to the bases of the bipolar transistor $Q_{REF}$ and the bases of the bipolar transistors Q1, Q2, ... $Q_N$ to eliminate the beta dependency of the output current $I_{OUT}$ and account for dynamic impacts caused by switching of the DAC 402. The voltage stabilization stage 416 may sense voltage variations at the collector of the bipolar transistor $Q_{ref}$ and steady the voltage at the output node 416B to compensate the current drawn (or provided) to the base of bipolar transistor $Q_{REF}$, and with the bases of the bipolar transistors Q1, Q2, ... $Q_N$. This can ensure that the base voltage can be maintained despite dynamic changes in the conditions of the DAC 402 to provide a steady output current as a function of the reference current and the input code for the DAC.

FIG. 4 (and the other figures of this disclosure) is provided for illustration and should not be construed to confine the present disclosure. For example, in the type of transistor may vary in different embodiments. Specifically, FIG. 4 depicts PNP bipolar transistors. But, as will be appreciated, various embodiments may comprise NPN bipolar transistors, or other transistors.

Figure 5:
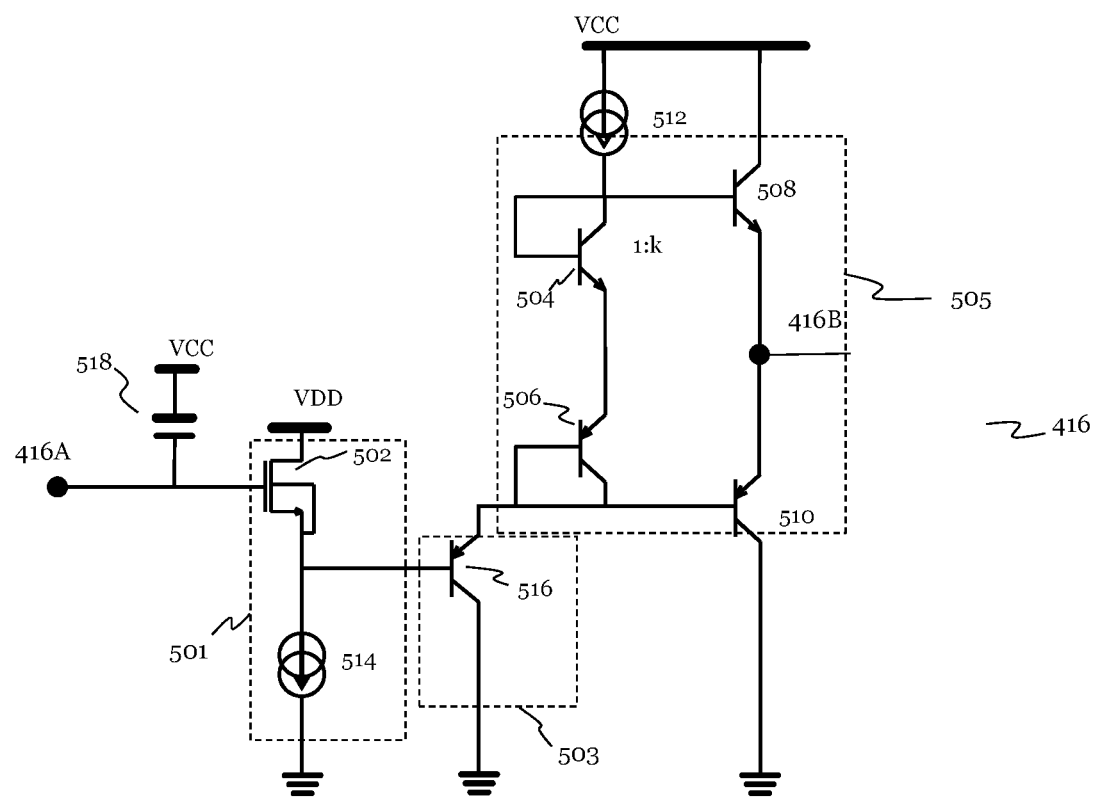
FIG. 5 depicts an voltage stabilization stage consistent with an embodiment.

FIG. 5 depicts an voltage stabilization stage consistent with embodiments.

In various embodiments, the voltage stabilization stage 416 may comprise a MOSFET 502. The gate of the MOSFET 502 may be coupled with the reference node 416A, which may be coupled with the collector of bipolar transistor $Q_{ref}$ (depicted at least in FIG. 4). An output of the voltage stabilization stage 416 may be coupled with output node 416B at the base of bipolar transistor $Q_{ref}$, and with the bases of the bipolar transistors Q1, Q2, ... $Q_N$.

In various embodiments, the voltage stabilization stage 416 may further comprise a first biasing transistor 504 and a second biasing transistor 506. The voltage stabilization stage 416 may further comprise a first output bipolar transistor 508 and a second output bipolar transistor 510. The voltage stabilization stage 416 may comprise a top reference current source 512 and a bottom reference current source 514. The voltage stabilization stage 416 may also comprise a voltage-setting bipolar transistor 516 and a capacitor 518. The capacitor 518 may be beneficial for system stability. The base of the first biasing transistor 504 may be coupled with the base of the first output bipolar transistor 508. And, the base of the second biasing transistor 506 may be coupled with the base of the second output bipolar transistor 510. The collector of the first biasing transistor 504 may be coupled with the top reference current source 512 and the base of the first biasing transistor 504 (and the base of the first output bipolar transistor 508). The emitter of the first biasing transistor 504 may be coupled with the emitter of the second biasing transistor 506. The first biasing transistor 504 and the second biasing transistor 506 may comprise a pair of complementary bipolar transistors of different types of transistor (for example, one NPN and one PNP). The emitter of the first output bipolar transistor 508 may be coupled with the emitter of the second output bipolar transistor 510. The first output bipolar transistor 508 and the second output bipolar transistor 510 may comprise a pair of complementary bipolar transistors of different types of transistors (for example, one NPN and one PNP).

The voltage stabilization stage 416 may comprise a voltage-sensing stage 501, a voltage follower 503, and an output stage 505. The voltage setting transistor 516 may comprise an emitter follower.

Figure 6:
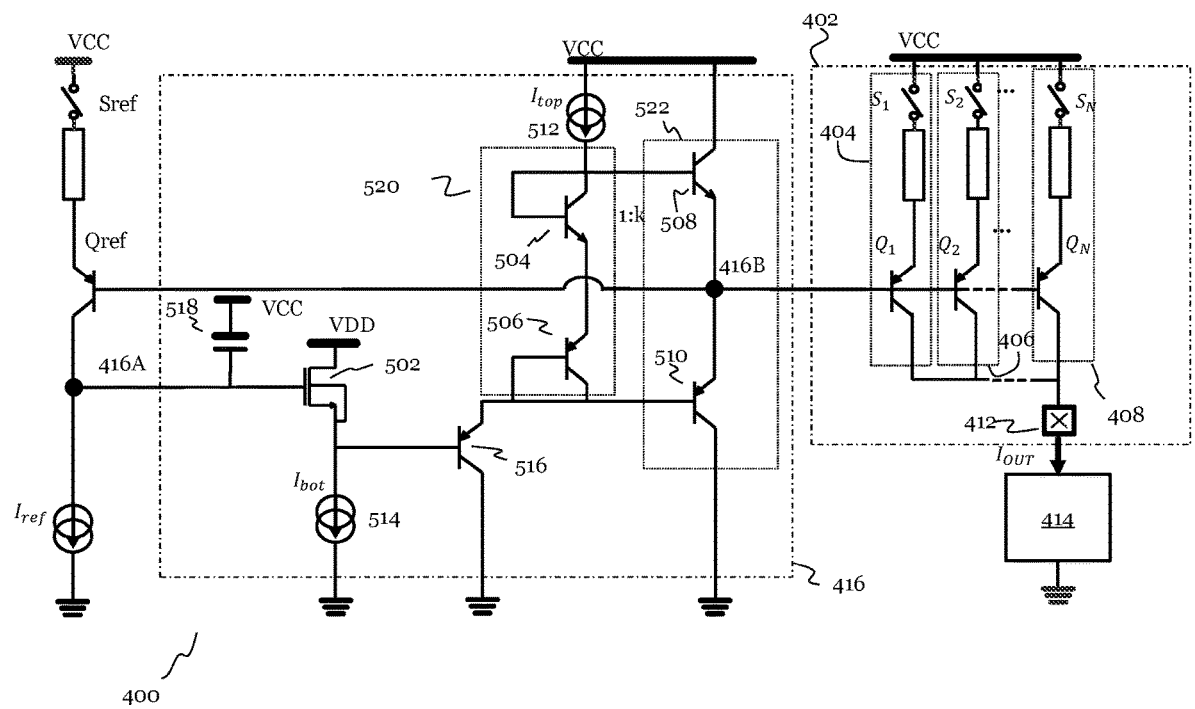
FIG. 6 depicts an adaptive current driving system consistent with an embodiment.

FIG. 6 depicts an adaptive current driving system in accordance with an embodiment.

Unless otherwise noted, the same reference numerals or identifier may be to identify the same components in different figures. To avoid redundancy, explanation for such components may not be recited for each figure.

The MOSFET 502, voltage-setting bipolar transistor 516, first biasing transistor 504, second biasing transistor 506, first output bipolar transistor 508, and second output bipolar transistor 510 may establish a control loop that decreases the input impedance of the collector of the bipolar transistor $Q_{ref}$ seen at the reference node 416A by the current generator $I_{ref}$. For example, a voltage change sensed at reference node 416A may comprise an input for the control loop and accordingly change the emitter-base voltage of the bipolar transistor Qref.

The gate of the MOSFET 502 may be coupled with the collector the of the reference bipolar transistor $Q_{ref}$. As will be appreciated, this may allow the MOSFET to be opened and closed as the voltage varies at the collector of the reference bipolar transistor $Q_{ref}$. In this way, the MOSFET 502 may sense the voltage at the collector of the reference bipolar transistor to maintain a loop between the base of the reference bipolar transistor $Q_{ref}$ and the collector.

The MOSFET 502 and the voltage-setting transistor 516 together act as a voltage level adjustment from the reference node 416A to the output node 416B for the second output bipolar transistor 510 and the first output bipolar transistor 508. As arranged in FIG. 6, since a constant current ($I_{bot}$) is imposed, the source of MOSFET 502 should vary accordingly to node 416A. Similarly, bipolar 516 is biased with a constant current ($I_{top}$) and therefore its emitter voltage should vary accordingly to its base voltage, that is coupled with MOSFET 502 source, acting as a voltage follower. Summarizing, a change in the voltage at the reference node can thus be sensed by the MOSFET 502 and then produce a drive voltage at the base of voltage-setting transistor 516, which may buffer the drive voltage and provide it as in input voltage signal for the output stage of the voltage stabilization stage 416. Input voltage for the output stage is dynamically adjusted depending on the voltage at the reference node. It may be advantageous to utilize a MOSFET to sense voltage at the reference node to avoid current consumption.

The voltage at the collector of the reference bipolar transistor $Q_{ref}$ may change accordingly to the current needs of system. By way of example, in case of a change of configuration of the transistors Q1 ... $Q_N$ of the DAC 402, the voltage of node 416B may also change because of the base current variation. This change is sensed by $Q_{ref}$ base and affects node 416A voltage. In turn, the variation of node 416A is seen as an input for the control loop that will bias the output stage to steady the voltage at the output node 416B at the base of transistors $Q_1$ ... $Q_N$ of the DAC 402.

The voltage stabilization stage 416 may allow the adaptive current driving system 400 to adjust to the static and dynamic current demands of the DAC 402. For example, a maximum output current may be supplied by the DAC 402 in response to a digital input code (input code may close each of the N switches activating each of the N-DAC cells). The maximum output current may be provided statically as long as dictated by the input to the DAC. However, as will be appreciated, the current demands of the DAC may vary dynamically during turn-on and turn-off due to the base capacitance of the bipolar transistors Q1, Q2 ... $Q_N$. The voltage stabilization stage 416 may be sized and configured to meet the maximum static and dynamic current demands of the DAC and adaptively steady the base voltage to provide the current based on the voltage sensed by the MOSFET 502.

The bases of first output bipolar transistor 508 and second output bipolar transistor 510 may be connected to bases of first biasing bipolar transistor 504 and second biasing bipolar transistor 506, respectively. Because of this, the sum of the base-emitter voltages in the branch 520 and branch 522 may be equal by construction. This may ensure that, whenever the voltage buffered by the voltage-setting transistor 516 shifts (seen at the base of the second biasing transistor 506 and base of the second output transistor 510), the relationship between base-emitter voltages between bipolar transistors 504, 506, 508 and 510 is maintained.

Biasing currents of the branches 522 and consequently 520 must be determined in advance accordingly to system requirements. The transistors in the output branch 522 of the voltage stabilization stage 416 and the biasing branch 520 of the voltage stabilization stage 416 may be sized so that current through the output branch 522 mirrors current through the biasing branch 520 by a factor "k". The factor "k" may refer to the ratio between the geometrical sizes of bipolar transistors in branch 522 and the bipolar transistors in branch 520 and consequently between their biasing currents. A proper choice of factor "k" may allow the efficiency of the system to be improved.

In various embodiments, the top reference current source 512 may provide a current source $I_{top}$ set according to Equation 3.

$$I_{top} = \frac{I_{out,MAX}}{k*\beta^2} \quad \text{Equation 3}$$

In Equation 3, $I_{out,MAX}$, may refer to the maximum output current for the DAC (static current) in addition to the current needed to charge each of the N bipolar transistors $Q_1$, $Q_2$ ... $Q_N$ (dynamic current). The variable "k" may refer to the ratio of current in the output branch 522 and the biasing branch 520 of the voltage stabilization stage 416. And, β may refer to the beta factor of the transistors used. $I_{top}$ may be used to bias the first biasing transistor 504, the second biasing transistor 506, and the voltage-setting transistor 516.

In various embodiments, bottom reference current source 514 may provide a current source $I_{bot}$ set according to Equation 4. $I_{bot}$ may be used to bias MOSFET 502 and provide base current for voltage setting transistor 516.

$$I_{bot} > \frac{I_{top}}{\beta} \quad \text{Equation 4}$$

As will be appreciated, such current setting would compensate the base current consumption of the voltage setting transistor 516. Further, due to the very high impedance of the gate of the MOSFET 502, the voltage stabilization stage 416 may not consume from the reference current generator $I_{ref}$. The output current $I_{OUT}$ may be described by Equation 5.

$$I_{OUT}=m*I_{ref} \quad \text{Equation 5}$$

In Equation 5, "m" may refer the number of DAC cells activated, which may depend on the input code provided to the DAC 402. As it will be appreciated, a steady voltage at the output node 416B and the very high current capability of branch 522 may guarantee the proportionality between the reference current and the output current.

As will be appreciated, the first output bipolar transistor 508 and the second output bipolar transistor 510 may form a Class AB amplifier. This may be advantageous to efficiently drive base capacitance during turn-on and turn-turn-off transients and enhance the robustness of a DAC against current kick backs generated as a result of fast code switching. The voltage setting transistor 516 may drive the Class AB amplifier according to the voltage at its emitter.

The voltage-setting bipolar transistor 516, together with MOSFET 502, may form a two-stage emitter follower. This may be advantageous to provide high current capability and low output impedance.

As will be appreciated, biasing of the first output bipolar transistor 508 and the second output bipolar transistor 510 may be achieved using various components or combinations of components (resistors, PMOS, NMOS, diodes, etc) in place of the biasing transistors in branch 520. For example, the second biasing transistor 506 and the first biasing transistor 504 may be replaced with resistors, diodes or other biasing components. Similarly, top reference current source 512, and bottom reference current source 514 may be replaced with resistors selected to bias the first output bipolar transistor 508 and second output bipolar transistor 510 and sized in order to achieve currents in accordance to equations 3 and 4.

Figure 7:
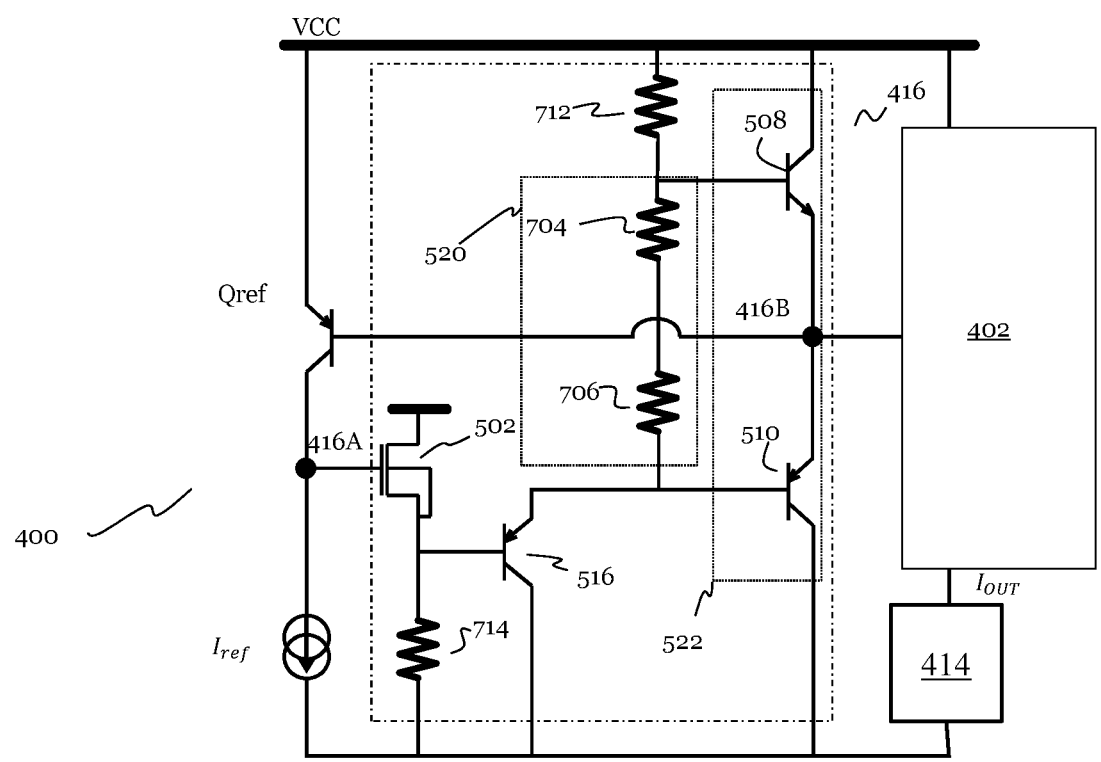
FIG. 7 depicts an adaptive current driving system including biasing resistors consistent with an embodiment.

FIG. 7 depicts an adaptive current driving system including biasing resistors in accordance with an embodiment.

In various embodiments, a current $I_{top}$ may be provided approximately by selecting an appropriate resistor, in accordance with Equation 3, given the voltage VCC. The first biasing transistor 504 and the second biasing transistor 506 may also be replaced with resistors. Similarly, the bottom reference current source 514 may be replaced with a resistor selected to approximately provide a current $I_{bot}$ in accordance with Equation 4.

In various embodiments, the voltage stabilization stage 416 may comprise a biasing resistor 712, a biasing resistor 704, and a biasing resistor 706. The biasing resistors 704 and the biasing resistor 706 may be disposed on the biasing branch 520. The biasing resistor 712 may be coupled at separate ends with a voltage source VCC and a base of the first output bipolar transistor 508.

The voltage stabilization stage 416 may also comprise a biasing resistor 714 coupled with source of the MOSFET 502 and the base of the voltage-setting bipolar transistor 516. As will be appreciated, the voltage stabilization stage 416 may take different forms in different embodiments. And, the various biasing elements may be formed by different components in different embodiments. FIG. 7 is provided for illustrative purposes and should not be construed to limit the present disclosure.

The DAC 402 and the reference bipolar transistor $Q_{ref}$ have been illustrated with PNP transistors. In various embodiment, an voltage stabilization stage 416 may be utilized with a DAC comprising NPN bipolar transistors, an NPN reference transistor or both.

Figure 8:
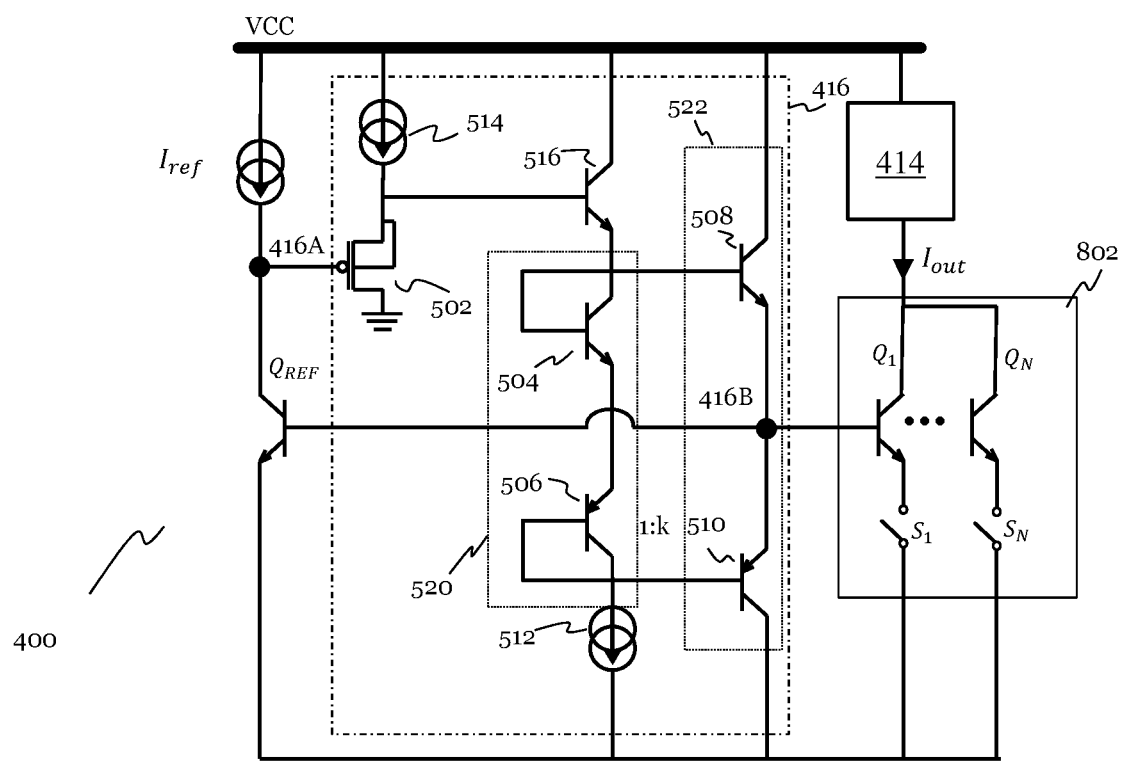
FIG. 8 illustrates an embodiment of an adaptive current driving system consistent with an embodiment.

FIG. 8 illustrates an embodiment of an adaptive current driving system consistent with an embodiment.

In various embodiments the voltage stabilization stage 416 may implemented using a PMOS input gate and an NPN follower, making it suitable to drive NPN based DAC cells. For example, MOSFET 502 may comprise a PMOS coupled at a gate with the collector of bipolar transistor $Q_{ref}$, which may comprise an NPN bipolar transistor. The voltage-setting bipolar transistor 516 may comprise an NPN bipolar transistor coupled at a base with the source of the MOSFET 502. The bottom reference current source 514 may be coupled at the source of the MOSFET 502 and, here, be disposed on the high-side of the arrangement. The top reference current source 512 may be disposed at the low and coupled with the second biasing transistor 506 at a collector. DAC 802 may comprise NPN transistors in various embodiments to amplify the current received at their gates.

Figure 9:
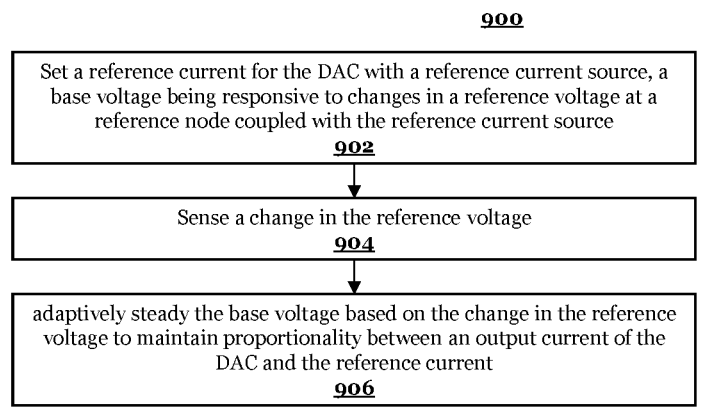
FIG. 9 illustrates a method to drive a digital to analog converter consistent with an embodiment.

FIG. 9 illustrates a method to drive a digital to analog converter consistent with an embodiment.

In various embodiments, the method 900 includes, at a step 902, setting a reference current for the DAC with a reference current source, a base voltage being responsive to changes in a reference voltage at a reference node coupled with the reference current source; at a step 904, sensing a change in the reference voltage; and, at a step 906, adaptively steadying the base voltage based on the change in the reference voltage to maintain proportionality between an output current of the DAC and the reference current.

In various embodiments, the method 900 may include, wherein adaptively steadying the base voltage comprises driving an amplifier with a drive voltage, the drive voltage varying with the change in the reference voltage.

In various embodiments, the method 900 may include, wherein adaptively steadying the base voltage further comprises biasing the amplifier with a bias current inversely proportional to a beta factor of a bipolar transistor of a DAC cell of the DAC.

In various embodiments, the method 900 may include, wherein the amplifier comprises a Class AB amplifier.

In various embodiments, the method 900 may include, wherein driving the amplifier comprises providing the drive voltage to a base of an emitter follower, an emitter of the emitter follower being coupled with an input of the class AB amplifier.

In various embodiments, the method 900 may include, wherein adaptively steadying the base voltage comprises setting the base voltage at an output of the amplifier.

In various embodiments, the method 900 may include providing the base voltage to a base of a reference bipolar transistor, the reference current source being coupled with a collector of the reference bipolar transistor.

In various embodiments, the method 900 may include providing the base voltage to a base of a bipolar transistor of a DAC cell of the DAC.

In various embodiments, the method 900 may include using a MOSFET coupled with the reference node at a gate of the MOSFET to sense the change in the reference voltage.

In various embodiments, the method 900 may include, wherein adaptively steadying the base voltage comprises using the change in the reference voltage as an input for a control loop used to adapt the base voltage.

Example 1. A method to drive a digital to analog converter (DAC), the method including: setting a reference current for the DAC with a reference current source, a base voltage being responsive to changes in a reference voltage at a reference node coupled with the reference current source; sensing a change in the reference voltage; and adaptively steadying the base voltage based on the change in the reference voltage to maintain proportionality between an output current of the DAC and the reference current.

Example 2. The method of Example 1, wherein adaptively steadying the base voltage includes driving an amplifier with a drive voltage, the drive voltage varying with the change in the reference voltage.

Example 3. The methods of Example 1 and Example 2, wherein adaptively steadying the base voltage further includes biasing the amplifier with a bias current inversely proportional to a beta factor of a bipolar transistor of a DAC cell of the DAC.

Example 4. The methods of Example 1 through Example 3, wherein the amplifier includes a Class AB amplifier.

Example 5. The methods of Example 1 through Example 4, wherein driving the amplifier includes providing the drive voltage to a base of an emitter follower, an emitter of the emitter follower being coupled with an input of the Class AB amplifier.

Example 6. The methods of Example 1 through Example 5, wherein adaptively steadying the base voltage includes setting the base voltage at an output of the amplifier.

Example 7. The methods of Example 1 through Example 6, further including providing the base voltage to a base of a reference bipolar transistor, the reference current source being coupled with a collector of the reference bipolar transistor.

Example 8. The methods of Example 1 through Example 7, further including providing the base voltage to a base of a bipolar transistor of a DAC cell of the DAC.

Example 9. The methods of Example 1 through Example 8, further including using a MOSFET coupled with the reference node at a gate of the MOSFET to sense the change in the reference voltage.

Example 10. The methods of Example 1 through Example 9, wherein adaptively steadying the base voltage includes using the change in the reference voltage as an input for a control loop used to adapt the base voltage.

Example. 11. A voltage stabilization stage for a digital to analog converter (DAC), the voltage stabilization stage including: a voltage sensing stage coupled with a reference node to sense a change in a voltage at the reference node, the reference node be coupled with a reference current source; a voltage follower coupled with the voltage sensing stage and configured to buffer a voltage signal, the voltage signal depending on the change in the voltage at the reference node; and an output stage configured to output a base voltage depending on the voltage signal.

Example. 12. The voltage stabilization stage of Example 11, wherein the voltage sensing stage includes a MOSFET, the MOSFET being coupled at a gate with the reference node and the MOSFET being coupled at a source with the voltage sensing stage.

Example. 13. The voltage stabilization stages of Example 11 and Example 12, wherein the voltage follower comprises an emitter follower, the emitter follower being coupled at a base with the source of the MOSFET.

Example. 14. The voltage stabilization stages of Example 11 through Example 13, wherein the output stage includes a Class AB amplifier, an input of the Class AB amplifier being coupled with an emitter of the emitter follower.

Example. 15. The voltage stabilization stages of Example 11 through Example 14, wherein the Class AB Amplifier includes an output branch and a biasing branch the output branch including a pair of complementary bipolar transistors, an emitter of a first bipolar transistor of the pair of complementary bipolar transistors being coupled with an emitter of a second bipolar transistor of the pair of complementary bipolar transistors.

Example. 16. The voltage stabilization stages of Example 11 through Example 15, wherein the biasing branch is coupled at one node with the emitter of the emitter follower, coupled with a voltage source at a second node, and coupled with the base of the first bipolar transistor at a first biasing node, and the base of the second bipolar transistor at a second biasing node.

Example 17. An adaptive current driving system, the adaptive current driving system including: a digital to analog converter (DAC) including: an input to receive a digital code including a number N bits; and N DAC cells, each of the N DAC cells including a bipolar transistor, and each of the N DAC cells being configured to be activated depending on a state of a corresponding bit of the digital code; a reference stage including a reference bipolar transistor coupled at a collector with a reference current source and being coupled at a base with the bases of the bipolar transistors of the N DAC cells; and a voltage stabilization stage including a voltage sensing stage coupled with a reference node to sense a change in a voltage at the reference node, the reference node being coupled with the collector of the reference bipolar transistor, a voltage follower coupled with the voltage sensing stage and configured to buffer a voltage signal, the voltage signal depending on the change in the voltage at the reference node, and an output stage configured to adaptively steady a base voltage at the base of the reference bipolar transistor depending on the voltage signal.

Example 18. The adaptive current driving system of Example 17, wherein the voltage sensing stage includes a MOSFET, the MOSFET being coupled at a gate with the reference node and the MOSFET being coupled at a source with the a voltage follower.

Example 19. The adaptive current driving systems of Example 17 and Example 18, wherein the voltage follower includes an emitter follower, the emitter follower being coupled at a base with the source of the MOSFET.

Example 20. The adaptive current driving systems of Examples 17 through Example 19, wherein the output stage includes a Class AB amplifier, an input of the Class AB amplifier being coupled with an emitter of the emitter follower.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method to drive a digital to analog converter (DAC), the method comprising:
    setting a reference current for the DAC with a reference current source, a base voltage being responsive to changes in a reference voltage at a reference node coupled with the reference current source;
    sensing a change in the reference voltage; and
    adaptively steadying the base voltage based on the change in the reference voltage.

2. The method of claim 1, wherein adaptively steadying the base voltage comprises driving an amplifier with a drive voltage, the drive voltage varying with the changes in the reference voltage.

3. The method of claim 2, wherein adaptively steadying the base voltage further comprises biasing the amplifier with a bias current inversely proportional to a beta factor of a bipolar transistor of a DAC cell of the DAC.

4. The method of claim 2, wherein the amplifier comprises a Class AB amplifier.

5. The method of claim 4, wherein driving the amplifier comprises providing the drive voltage to a base of an emitter follower, an emitter of the emitter follower being coupled with an input of the Class AB amplifier.

6. The method of claim 2, wherein adaptively steadying the base voltage comprises setting the base voltage at an output of the amplifier.

7. The method of claim 2, further comprising providing the base voltage to a base of a reference bipolar transistor, the reference current source being coupled with a collector of the reference bipolar transistor.

8. The method of claim 7, further comprising providing the base voltage to a base of a bipolar transistor of a DAC cell of the DAC.

9. The method of claim 1, further comprising using a MOSFET coupled with the reference node at a gate of the MOSFET to sense the changes in the reference voltage.

10. The method of claim 1, wherein adaptively steadying the base voltage comprises using the changes in the reference voltage as an input for a control loop used to adapt the base voltage.

11. A voltage stabilization stage for a digital to analog converter (DAC), the voltage stabilization stage comprising:
    a voltage sensing stage coupled with a reference node to sense a change in a voltage at the reference node, the reference node be coupled with a reference current source;
    a voltage follower coupled with the voltage sensing stage and configured to buffer a voltage signal, the voltage signal depending on the change in the voltage at the reference node; and
    an output stage configured to output a base voltage depending on the voltage signal.

12. The voltage stabilization stage of claim 11, wherein the voltage sensing stage comprises a MOSFET, the MOSFET being coupled at a gate with the reference node and the MOSFET being coupled at a source with the voltage follower.

13. The voltage stabilization stage of claim 12, wherein the voltage follower comprises an emitter follower, the emitter follower being coupled at a base with the source of the MOSFET.

14. The voltage stabilization stage of claim 13, wherein the output stage comprises a Class AB amplifier, an input of the Class AB amplifier being coupled with an emitter of the emitter follower.

15. The voltage stabilization stage of claim 14, wherein the Class AB Amplifier comprises an output branch and a biasing branch the output branch comprising a pair of complementary bipolar transistors, an emitter of a first bipolar transistor of the pair of complementary bipolar transistors being coupled with an emitter of a second bipolar transistor of the pair of complementary bipolar transistors.

16. The voltage stabilization stage of claim 15, wherein the biasing branch is coupled at one node with the emitter of the emitter follower, coupled with a voltage source at a second node, and coupled with the base of the first bipolar transistor at a first biasing node, and the base of the second bipolar transistor at a second biasing node.

17. An adaptive current driving system, the adaptive current driving system comprising:
a digital to analog converter (DAC) comprising:
an input to receive a digital code comprising a number N bits; and
N DAC cells, each of the N DAC cells comprising a bipolar transistor, and each of the N DAC cells being configured to be activated depending on a state of a corresponding bit of the digital code;
a reference stage comprising a reference bipolar transistor coupled at a collector with a reference current source and being coupled at a base with the bases of the bipolar transistors of the N DAC cells; and
a voltage stabilization stage comprising a voltage sensing stage coupled with a reference node to sense a change in a voltage at the reference node, the reference node being coupled with the collector of the reference bipolar transistor, a voltage follower coupled with the voltage sensing stage and configured to buffer a voltage signal, the voltage signal depending on the change in the voltage at the reference node, and an output stage configured to adaptively steady a base voltage at the base of the reference bipolar transistor depending on the voltage signal.

18. The adaptive current driving system of claim 17, wherein the voltage sensing stage comprises a MOSFET, the MOSFET being coupled at a gate with the reference node and the MOSFET being coupled at a source with the voltage sensing stage.

19. The adaptive current driving system of claim 18, wherein the voltage follower comprises an emitter follower, the emitter follower being coupled at a base with the source of the MOSFET.

20. The adaptive current driving system of claim 19, wherein the output stage comprises a Class AB amplifier, an input of the Class AB amplifier being coupled with an emitter of the emitter follower.

* * * * *